TRANSISTOR AMPLIFIER-OSCILLATOR WITH A FEEDBACK SWITCHING CIRCUIT

Filed June 18, 1962

INVENTORS
Robert C. Carter
Robert H. Rogers
BY Moody and Antrim
Agents

United States Patent Office 3,193,777

Patented July 6, 1965

3,193,777
TRANSISTOR AMPLIFIER-OSCILLATOR WITH A FEEDBACK SWITCHING CIRCUIT

Robert C. Carter, Richardson, Tex., and Robert H. Rogers, East Lansing, Mich., assignors to Collins Radio Company, Cedar Rapids, Iowa, a corporation of Iowa Filed June 18, 1962, Ser. No. 203,164
3 Claims. (Cl. 331—59)

This invention pertains to amplifier stages with regenerative circuits and particularly to circuits that may be selectively controlled to function as either an amplifier or an oscillator.

Amplifier-oscillator stages according to this invention are useful in tone operated squelch circuits of transceivers in which the stages during receiving function to amplify a tone of a particular frequency that is used to operate a squelch circuit and during transmission function to generate a tone of the same frequency, or of a slightly different frequency, that is used to modulate the carrier output. The circuit described herein is adaptable to various equipments; a small number of component parts are used. It uses two transistors that are connected respectively in a grounded base configuration in which the current gain is relatively stable, and in a grounded collector configuration in which the voltage gain is relatively stable. Two simple impedance circuits utilizing resistors and capacitors are connected in a positive feedback arrangement to utilize these stable gain characteristics for providing an amplifier-oscillator with stable frequency characteristics. The design of an amplifier-oscillator according to this invention is described in an article, "Combined Oscillator-Amplifier for Tone Transceivers," by R. C. Carter published in the February 2, 1962, issue of "Electronics."

An object of this invention is to provide a regenerative transistor circuit that can be readily controlled for operation as a bandpass amplifier or as an ocillator.

A feature of this invention is the relatively simple construction required to provide dual functions.

Another feature is the desirable degree of frequency stability that is obtained in a simple transistor circuit.

Another feature of the circuit as designed to be operated at low frequencies is its compactness compared with circuits using inductive elements.

Figure 1:
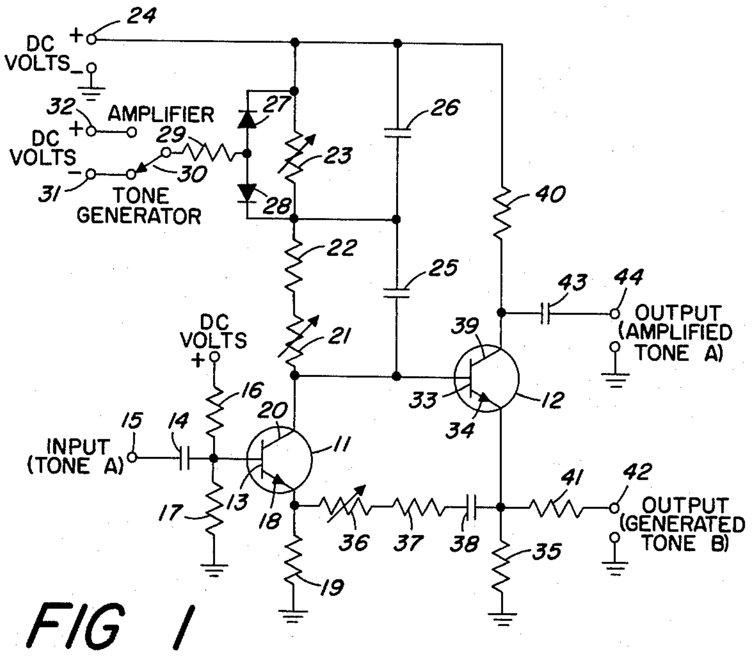
Figure 2:
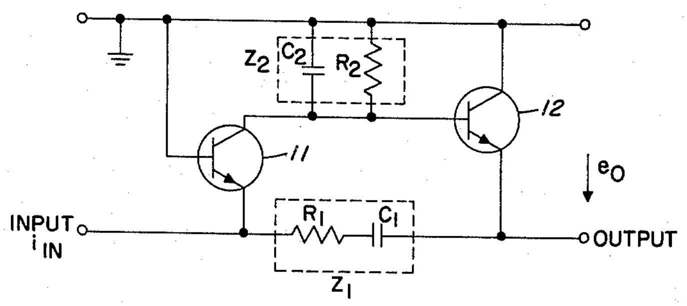

The following description and the appended claims can be more readily understood with reference to the accompanying drawings in which:

FIG. 1 is a schematic diagram of the amplifier-oscillator of this invention, and, FIG. 2 is a simplified functional diagram as a reference for equations.

With reference to FIG. 1, a first transistor stage operating essentially as a common base stage is connected to a second transistor stage operating essentially as a common collector stage. The collector of the first stage is connected to an impedance circuit that may be adjustable for determining whether the regenerative circuit operates as an amplifier or as an oscillator. To drive the transistor of the second stage, its base is connected directly to the collector of the first stage. The emitters of both transistors have bias supplied through resistors to ground. A feedback circuit comprising a series resistor and a capacitor is connected between the emitters. The maximum frequency response as an amplifier or the frequency of operation as an oscillator is determined by the sum of the time constants of the feedback circuit and of the circuit that is coupled to the collector of the first transistor. These two circuits control the net phase shift around the loop. The phase shift must be zero for maximum regeneration.

In more detail, the base 13 of transistor 11 is connected to the junction of series resistors 16 and 17 and to capacitor 14. An input terminal 15 is connected to capacitor 14 for applying signal that is to be amplified to the base 13 to vary the collector current of transistor 11. The series resistors 16 and 17 comprise a usual biasing voltage divider connected between a terminal to which positive constant voltage is applied and ground, or the common return circuit. The emitter 18 of transistor 11 is connected through resistor 19 to ground.

In addition to resistor 19 in the emitter circuit, the collector circuit includes an adjustable impedance circuit that is connected to the collector 20 of transistor 11. Disregarding the short-circuiting switch in the collector circuit, the collector 20 of transistor 11 is connected through a series resistor 21, 22 and 23 to terminal 24 that is connected to a source of positive operating voltage. To provide the desired impedance in the collector circuit, capacitor 25 is connected in parallel with resistors 21 and 22 and capacitor 26 is connected in parallel with resistor 23. When the amplifier-oscillator is operating as an oscillator and the switching circuit in the collector circuit is effectively open, the impedance provided by parallel capacitor 25 and resistors 21 and 22 is in series with the impedance provided by parallel capacitor 26 and resistor 23. The latter portion of the circuit is short-circuited when the amplifier-oscillator is to function as an amplifier. The resistor 21 is adjustable for determining the frequency at which the amplifier-oscillator has maximum response as an amplifier and resistor 23 is adjustable for determining the frequency of operation as an oscillator.

The switching circuit for short-circuiting a portion of the collector impedance includes a pair of diodes 27 and 28 connected in series but in opposite sense across the parallel resistor 23 and capacitor 26. The junction of the series diodes is connected through resistor 29 to the two-position selector switch 30. When the amplifier-oscillator is to operate as a generator, the switch 30 connects terminal 31 through resistor 29 to apply potential to the junction of the diodes as required for biasing them beyond cutoff. In the particular circuit shown in FIG. 1, required potential could be supplied by connecting terminal 31 directly to ground. The voltage must be of the proper polarity and potential to cause diodes 27 and 28 to be nonconductive during maximum current flow in the emitter circuit when the voltage at the junction of resistors 22 and 23 is minimum with respect to ground. When the switch 30 is in the position for operation as an amplifier, voltage from the terminal 32 is applied through resistor 29 to bias the diodes 27 and 28. The voltage applied to terminal 32 is the same polarity and slightly greater than the voltage applied to the supply terminal 24. The diodes 27 and 28 are therefore, conductive for effectively short-circuiting the parallel resistor 23 and capacitor 26.

In order to apply signal to the base-emitter circuit of the transistor 12, collector 20 of the transistor 11 is connected directly to the base 33 of the transistor 12. The emitter 34 of the transistor 12 is connected through resistor 35 to ground. A feedback circuit comprising an adjustable resistor 36, resistor 37, and capacitor 38 in series is connected between the emitter 18 of the transistor 11 and the emitter 34 of the transistor 12. The capacitive reactance of this feedback circuit and the capacitive reactance of the capacitors 25 and 26 in the collector circuit of transistor 11 provide the required phase shift to produce maximum regeneration at the desired frequency of operation.

The collector 39 of transistor 12 may be connected directly to supply terminal 24, or when an output is to be connected to the collector 39, the collector may be connected through resistor 40 to terminal 24. An output terminal 44 is connected through capacitor 43 to the collector 39. Another output terminal 42 is shown connected through resistor 41 to the emitter 34 of transistor 12. The output connected to terminal 44 for the amplified tone and the output shown connected to terminal 42 for the generator tone may both be connected to either the collector or the emitter, or they may be separated as shown and connected to the collector or the emitter circuit as desired dependent upon the impedance characteristics of the succeeding circuits and upon the amount of output voltage required.

With reference to FIG. 2, the impedance $Z_1$ obtained from a resistance $R_1$ in series with capacitance $C_1$ corresponds to the feedback circuit connected between the emitters of FIG. 1, and the impedance $Z_2$ obtained from the resistance $R_2$ in parallel with the capacitance $C_2$ corresponds to the impedance connected to the collector of transistor 11 and the base of transistor 12. In FIG. 1, the input is shown connected to base 13 of transistor 11 rather than to the emitter as shown in FIG. 2. The connection to the base raises the input impedance to a value that is more desirable for matching a previous driving circuit. The equations for gain are substantially correct even though the input connection has been changed for in deriving the equations it is assumed that the impedance $Z_1$ is much greater than the impedance looking into the emitter of transistor 11. Let the time constant $T_1=R_1C_1$, the time constant $T_2=R_2C_2$, $f$=frequency of operation in cycles per second, $s=j2\pi f$, $G_i$=current gain obtained from transistor 11 as a common base stage, $G_v$=voltage gain obtained from transistor 12 as a common collector stage, $G_p=G_iG_v$, and $K=G_pR_2C_1$, then when $G_c$ represents the closed-loop gain of the two stages $$G_c=\frac{K_s}{T_1T_2s^2+(T_1+T_2-K)s+1}$$

The value of K at the point of oscillation is $$K=T_1+T_2$$

When the feedback for positive regeneration is not much more than that required for oscillation, the waveform of the output is nearly sinusoidal. Then, when the circuit is oscillating and $f$ is the frequency of oscillation $$f=\frac{1}{2\pi\sqrt{T_1T_2}}$$

For simplification, let $T_1=T_2=T_0$ then $$f=\frac{1}{2\pi T_0}$$

In designing an oscillator, $$R_1=\tfrac{1}{2}R_2G_p,$$

and $$C_2=\tfrac{1}{2}C_1G_p$$

For a practical oscillator, however, $R_1$ should be slightly smaller than $\tfrac{1}{2}R_2G_p$ to ensure that the circuit is definitely unstable. As $R_1$ becomes very much smaller than $\tfrac{1}{2}R_2G_p$, the wave form of the output departs from a sinusoidal form.

When the impedance in the collector circuit of transistor 12 is decreased below the critical value at which oscillation starts, the absolute value of transistance, $$\frac{\text{output voltage}}{\text{input current}}\text{ or }\frac{e_0}{i_{in}}$$

for any radian frequency $\omega$ is:

$$|R_{21}(\omega)|=G_pR_2\sqrt{\frac{1+T_0^2\omega^2}{(1-T_0^2\omega^2)^2+\left(\frac{T_0\omega}{Q}\right)^2}}$$

where $T_1=T_2=T_0$, and $\omega=2\pi f$.

Although the impedance circuits might have inductors rather than capacitors, the advantage of compactness could not be retained for operation at low frequencies. Typical values for component parts of a circuit that uses type NPN transistors 2N338 for operation at a frequency of 170 cycles per second are:

| | | |
|---|---|---|
| Resistor 19 | ohms | 3,160 |
| Variable Resistor 21 | do | 2,000 |
| Resistor 22 | do | 8,660 |
| Variable Resistor 23 | do | 1,000 |
| Variable Resistor 36 | do | 500 |
| Resistor 37 | do | 4,220 |
| Resistor 35 | do | 6,800 |
| Resistor 40 | do | 3,900 |
| Capacitor 38 | microfarad | .22 |
| C105 | do | 0.1 |
| Capacitor 26 | do | 1 |

The stability in frequency and gain of a circuit according to this invention has proved to be good. Stability of the overall circuit is determined predominantly by that part of the circuit external to the transistors and not by relatively unstable parameters of the transistors. The gain is primarily dependent upon $\alpha$ (the ratio of change in collector current to change in emitter current) which is a characteristic of transistors relatively unaffected by changes in temperature.

Although this invention has been described with respect to a particular embodiment thereof, it is not to be so limited, as changes and modifications may be made therein which are within the spirit and scope of the invention as defined by the appended claims.

What is claimed is:

1. An amplifier-oscillator comprising, a first transistor having a first emitter, a first base, and a first collector, a second transistor having a second emitter, a second base, and a second collector, first and second resistors, said first and second emitters being connected through said first and second resistors respectively to a common return circuit, a first impedance circuit connected between said first emitter and said second emitter to provide a feedback circuit between said transistors, a second impedance circuit, a supply terminal for supplying direct-current operating voltage relative to said common return circuit, said first collector being connected to said second base, said joined collector and base being connected through said second impedance circuit to said supply terminal, a third resistor, said second collector being connected through said third resistor to said supply terminal, means for biasing said first base to cause said first transistor to operate over the relatively linear portion of its characteristic curve, a signal input terminal coupled to said first base, a signal output and a generator output coupled to said second transistor, said second impedance having a critical value above which said amplifier-oscillator is self-excited and below which it operates as an amplifier, and switching means connected to said second impedance circuit operable to one position for selecting for said second impedance circuit a value of impedance lower than said critical value and operable to another position for selecting for said second impedance circuit a value of impedance higher than said critical value.

2. An amplifier-oscillator as claimed in claim 1 in which said second impedance includes fourth and fifth resistors connected in series, a capacitor connected in parallel with said fourth resistor, said switching means including a pair of diodes, said diodes being connected in series across said fourth resistor, means for selectively applying first and second function-determining voltages to the junction of said diodes, said diodes connected in the required sense to become conductive for decreasing the impedance of said second impedance circuit below said critical value in response to the selection of said first function-determining voltage and to become non-conductive in response to application of said second function-determining voltage for increasing the impedance of said second impedance circuit above said critical value, said first function-determining voltage having the same polarity as the voltage applied to said supply terminal and higher potential than that applied from said supply terminal to said first series resistor.

3. In an amplifier-oscillator as claimed in claim 2 in which said first impedance circuit comprises a sixth resistor and a capacitor connected in series, said fifth resistor and said sixth resistor being adjustable for determining at what frequency the gain of the amplifier-oscillator is maximum for signal applied to said input terminal when the impedance of said second impedance is lower than said critical value.

References Cited by the Examiner

UNITED STATES PATENTS 3,070,757 12/62 Plogstedt et al. ______ 331—141 X

OTHER REFERENCES

"Combined Oscillator-Amplifier for Tone Transceivers," by Carter, in Electronics, vol. 35, Feb. 2, 1962, pages 44–47.

ROY LAKE, *Primary Examiner.*

JOHN KOMINSKI, *Examiner.*